_(12)_ United States Patent
Vizbaras et al.

(10) Patent No.: US 9,472,627 B2
(45) Date of Patent: Oct. 18, 2016

(54) SEMICONDUCTOR HETEROSTRUCTURE AND METHOD OF FABRICATION THEREOF

(71) Applicant: Brolis Semiconductors Ltd., Vilnius (LT)

(72) Inventors: Kristijonas Vizbaras, Vilnius (LT); Augustinas Vizbaras, Vilnius (LT)

(73) Assignee: Brolis Semiconductors Ltd., Vilnius (LT)

( * ) Notice: Subject to any disclaimer, the term of this patent is extended or adjusted under 35 U.S.C. 154(b) by 0 days.

(21) Appl. No.: 14/431,541

(22) PCT Filed: Oct. 17, 2013

(86) PCT No.: PCT/EP2013/071763
§ 371 (c)(1),
(2) Date: Mar. 26, 2015

(87) PCT Pub. No.: WO2014/060536
PCT Pub. Date: Apr. 24, 2014

(65) Prior Publication Data
US 2015/0249135 A1    Sep. 3, 2015

(30) Foreign Application Priority Data

Oct. 17, 2012    (EP) .................................. 12188884

(51) Int. Cl.
*H01S 5/00*        (2006.01)
*H01L 29/205*      (2006.01)
(Continued)

(52) U.S. Cl.
CPC ............. *H01L 29/205* (2013.01); *B82Y 20/00* (2013.01); *H01L 21/0237* (2013.01);
(Continued)

(58) Field of Classification Search
CPC ... H01L 29/205; H01L 29/15; H01L 29/737; H01L 33/0062; H01L 31/0304; H01L 29/7786; H01L 31/035236; H01L 33/06; H01L 33/0045; H01L 33/0025; H01L 31/184; H01L 33/30; H01L 21/02631; H01L 31/109; H01S 5/343
See application file for complete search history.

(56) References Cited

U.S. PATENT DOCUMENTS

| | | |
|---|---|---|
| 5,456,206 A | 10/1995 | Lee et al. |
| 7,498,182 B1 * | 3/2009 | Sampath ................ B82Y 20/00 438/21 |
| 2012/0199952 A1 * | 8/2012 | D'Evelyn ........... H01L 21/0237 257/615 |

FOREIGN PATENT DOCUMENTS

JP        2012089651 A    5/2012

OTHER PUBLICATIONS

A. Pavlovska et al., "In Situ Studies of the Role of Excess Ga on the Growth Morphology of Thin GaN Layers", Surface Science, vol. 496, Issue 3, pp. 160-178, Jan. 10, 2002.
(Continued)

*Primary Examiner* — Yuanda Zhang
(74) *Attorney, Agent, or Firm* — Moser Taboada

(57) ABSTRACT

A III-V compound semiconductor heterostructure grown on a substrate is described. The heterostructure includes a first semiconductor layer, wherein the first layer semiconductor layer is a compound semiconductor layer with (III) (V), wherein (III) represents one or more group-III elements and (V) represents one or more group-V elements, an intermediate layer on the first semiconductor layer, wherein the intermediate layer is a compound semiconductor layer with $(III)_{x>1}(V)_{2-x}$, and wherein the intermediate layer has a thickness of 10 monolayers or below, and a second semiconductor layer, wherein the first layer semiconductor layer is a compound semiconductor layer with $(III)_1(V)_1$.

10 Claims, 2 Drawing Sheets

(51) Int. Cl.
*H01L 21/02* (2006.01)
*H01L 29/737* (2006.01)
*H01L 29/778* (2006.01)
*H01L 29/201* (2006.01)
*H01L 33/30* (2010.01)
*H01S 5/34* (2006.01)
*B82Y 20/00* (2011.01)
*H01L 21/28* (2006.01)
*H01L 29/66* (2006.01)
*H01L 29/78* (2006.01)
*H01L 29/15* (2006.01)
*H01L 31/0304* (2006.01)
*H01L 31/0352* (2006.01)
*H01L 31/109* (2006.01)
*H01L 31/18* (2006.01)
*H01L 33/00* (2010.01)
*H01L 33/06* (2010.01)
*H01S 5/343* (2006.01)

(52) U.S. Cl.
CPC .. *H01L 21/02463* (2013.01); *H01L 21/02466* (2013.01); *H01L 21/02499* (2013.01); *H01L 21/02507* (2013.01); *H01L 21/02546* (2013.01); *H01L 21/02549* (2013.01); *H01L 21/02631* (2013.01); *H01L 21/28264* (2013.01); *H01L 29/15* (2013.01); *H01L 29/201* (2013.01); *H01L 29/66522* (2013.01); *H01L 29/737* (2013.01); *H01L 29/7371* (2013.01); *H01L 29/7786* (2013.01); *H01L 29/78* (2013.01); *H01L 31/0304* (2013.01); *H01L 31/035236* (2013.01); *H01L 31/109* (2013.01); *H01L 31/184* (2013.01); *H01L 33/0025* (2013.01); *H01L 33/0045* (2013.01); *H01L 33/0062* (2013.01); *H01L 33/06* (2013.01); *H01L 33/30* (2013.01); *H01S 5/3402* (2013.01); *H01S 5/343* (2013.01); *H01S 5/34306* (2013.01)

(56) References Cited

OTHER PUBLICATIONS

PCT Search Report and Written Opinion, PCT/EP2013/071763, 12 Pages, Date of Mailing Nov. 18, 2013.

\* cited by examiner

SEMICONDUCTOR HETEROSTRUCTURE AND METHOD OF FABRICATION THEREOF

TECHNICAL FIELD OF THE INVENTION

Embodiments of the present invention relate to semiconductor heterostructures for electronic and optoelectronic devices. Embodiments of the present invention particularly relate to III-V-antimonide-heterostructures, and specifically to a III-V-compound semiconductor heterostructure.

BACKGROUND OF THE INVENTION

The demand for electronic devices and optoelectronic devices for the infrared range can be met by semiconductor heterostructures based on group-III antimonides. From III-V compound semiconductor materials, antimonides offer a comparable small band gap, from 1.65 eV of AlAsSb down to 0.2 eV of InSb. Therefore, devices based on III-V-antimonide-heterostructures are well-suited as emitters for optical data transmission, solar energy harvesting, gas sensing applications, medical applications, plastic welding, etc.

For the fabrication of high-quality electronic and optoelectronic semiconductor devices, a precise control of the electronic band structure is desired. Accordingly, heterostructures with tailored compositional transitions are desired. In particular, layer quality after growth and the potential impact of high temperature processing steps on the layer quality have to be controlled and known. One aspect to be considered is interdiffusion resulting in a degradation of steep concentration profiles.

For example, semiconductor lasers operating in the 2-5 micrometer range and providing a high output power are a common desire. Such a semiconductor laser can be constructed of a stack of layers, typically III-V-semiconductors, formed on a binary substrate, such as GaSb, GaAs, InP, Si, InSb, InAs, GaP, or Ge. Some applications have employed semiconductor lasers with binary or/and ternary compounds for the waveguide and active region, while other applications use quaternary compounds or even quinternary compounds. For example mixed group-V quaternary alloys can be GaInAsSb, AlGaAsSb, and AlInAsSb, whereas AlGaInAsSb can be a quinternary alloy.

Particularly for high performance electronic and optoelectronic devices with band structures, which are complex and/or difficult to grow, as well as doping levels, which are complex and/or difficult to manufacture, interdiffusion or intermixing of materials in binary, ternary, quaternary and quinternary systems need to be considered and controlled.

Typically, heterostructures in binary, ternary, quaternary and quinternary system are grown under group-V-rich conditions, because group-III-rich conditions have been experiences to be disadvantageous due to droplet formation and the like. Further, there have been attempts to generate group-III-rich surfaces from group-V-rich surfaces, e.g. by heating in order to achieve a group-III-rich surface reconstruction of a semiconductor layer. This is for example described in patent application publication US 2009/0085073.

In view of the above, it is an object of the present invention to provide an improved semiconductor structure and improved methods of manufacturing thereof that overcome at least some of the problems in the art.

SUMMARY OF THE INVENTION

In light of the above, a III-V compound semiconductor heterostructure grown on a substrate according to independent claim 1 is provided. Further aspects, advantages, and features of the present invention are apparent from the dependent claims, the description, and the accompanying drawings.

According to one embodiment, a III-V compound semiconductor heterostructure grown on a substrate is provided. The heterostructure includes a first semiconductor layer, wherein the first layer semiconductor layer is a compound semiconductor layer with $(III)_1(V)_1$, wherein (III) represents one or more group-III elements and (V) represents one or more group-V elements, an intermediate layer on the first semiconductor layer, wherein the intermediate layer is a compound semiconductor layer with $(III)_{x>1}(V)_{2-x}$, and wherein the intermediate layer has a thickness of 10 monolayers or below, and a second semiconductor layer, wherein the first layer semiconductor layer is a compound semiconductor layer with $(III)_1(V)_1$.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Figure 1:
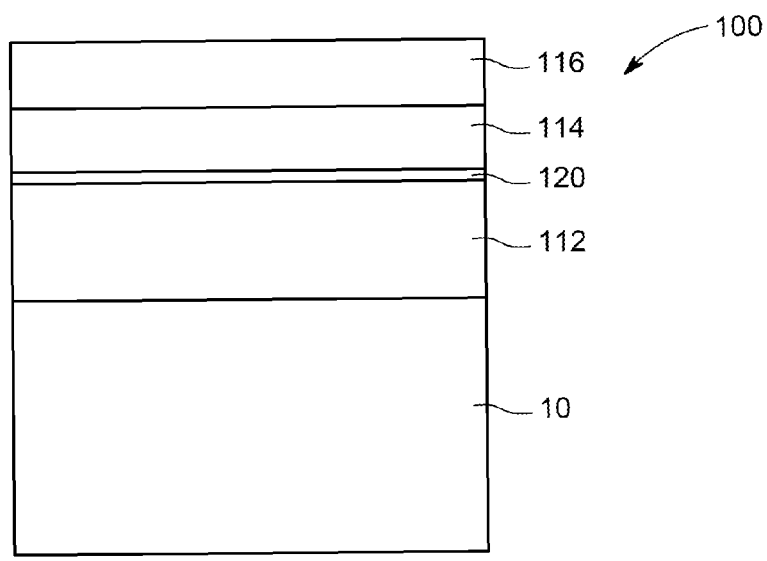
FIG. 1 shows schematically a first device with a layer stack and an intermediate layer according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Embodiments described herein refer to heterostructures. Accordingly, parts of e.g. a light emitting structure, such as a laser, a LED, a SLED, etc., are provided, wherein the heterostructures and devices include a compound semiconductor layer-stack. Typically, the formation of a heterostructure includes forming compound semiconductor layers $(III)_1(V)_1$, wherein (III) represents one or more group-III elements and (V) represents one or more group-V elements. According to typical embodiments, which can be combined with other embodiments described herein, such compound semiconductors can be described as $(A)_1(D)_1$, wherein A is selected from the group consisting of Al, Ga, and In, and D is selected from the group selected from the group consisting of As and Sb. Such compound semiconductors can further be described as $(AB)_1(D)_1$, wherein A and B are selected from the group consisting of Al, Ga, and In, and D is selected from the group selected from the group consisting of As and Sb, or $(A)_1(DE)_1$, wherein A is selected from the group consisting of Al, Ga, and In, and D and E are selected from the group selected from the group consisting of As and Sb; thereby, a ternary compound semiconductor is formed. Even further, such compound semiconductors can be described as $(AB)_1(DE)_1$, wherein A and B are selected from the group consisting of Al, Ga, and In, and D and E are selected from the group selected from the group consisting of As and Sb, or $(ABC)_1(D)_1$, wherein AB and C are selected from the group consisting of Al, Ga, and In, and D is selected from the group selected from the group consisting of As and Sb; thereby, a quaternary compound semiconductor is formed. Even further, such compound semiconductors can be described as $(ABC)_1(DE)_1$, wherein A, B and C are selected from the group consisting of Al, Ga, and In, and D and E are selected from the group selected from the group consisting of As and Sb; thereby, a quinternary compound semiconductor is formed. For the above compounds, the numeral "1" behind the brackets, i.e. $(\ldots)_1$ indicate that the one or more group-III elements and the one or more group-V elements are provided in the compound semiconductor under stoichiometric conditions, such that a crystal structure is grown, which could in theory be defect free.

Even though the $(III)_1(V)_1$ compound semiconductor layers are grown to be stoichiometric, they are typically grown under a group-V rich condition, i.e. the availability of group-V element atoms at the growth surface exceeds the availability of group-III element atoms. This usually results in a stable growth condition. Contrary thereto, an overplus of group-III element atoms might result in droplet formation and other defects to be incorporated in the semiconductor layer.

According to different embodiments, which can be combined with other embodiments described herein, the compound semiconductor layers $(III)_1(V)_1$, wherein (III) represents one or more group-III elements and (V) represents one or more group-V elements, can typically be grown on substrates selected from the group consisting of GaSb, GaAs, InP, Si, InSb, InAs, GaP, and Ge. Typically, substrate choice is determined by availability, lattice matching, costs or the like.

FIG. 1 shows a first heterostructure 100, which is exemplarily a MOSFET structure. A channel layer 112 is deposited or grown on the substrate 10. Typically, the deposition or growing of layer is conducted with molecular beam epitaxy (MBE) or specific forms of MBE, e.g. MOMBE, gas source MBE or the like. As described herein, growth under group-III rich or growth under group-V rich conditions can be used, wherein also non-stoichiometric layers can be generated. Typically, MBE is useful if growth or deposition away from equilibrium growth conditions is conducted and where lower temperatures are required. Use of CVD (e.g. PECVD) methods and other methods can be critical for non-stoichiometric layer, for growing materials inside or close-to solid-miscibility gap, for strained layers and for generating other properties beneficial for heterostructures. The channel layer is, for example, provided has a binary, ternary, quaternary, or quinternary semiconductor layer in the AlGaInAsSb system, such that the structure can be $(AlGaIn)_1(AsSb)_1$ if a quinternary structure is provided. A person skilled in the art will be able to appreciate that FIG. 1 shows only a portion of a MOSFET structure and that next to the channel layer other regions, i.e. doped regions for drain and source, might be provided. An oxide layer 114 is provided over the channel layer 112. In order to improve MOSFET performance an intermediate semiconductor compound layer 120 is provided on the channel layer and below the oxide layer 114. Thereby, according to typical embodiments, which can be combined with other embodiments described herein, the insertion or intermediate layer 120 can be in direct contact with the channel layer 112 and the oxide layer 114.

According to embodiments described herein, the intermediate layer is provided to have an understoichiometric property $(III)_{x>1}(V)_{x<1}$ or $(III)_{x>1}(V)_{2-x}$, i.e. a group-V understoichiometric property. According to typical embodiments, which can be combined with other embodiments described herein, x can be smaller than 2 and can particularly be 1.1 or smaller. Thereby, for example if x=1.1 a heterostructure with $(III)_{1.1}(V)_{0.9}$ can be provided. If x=1.05, for example a heterostructure with $(III)_{1.05}(V)_{0.95}$ is provided. According to yet further optional modifications, x can be 1.05 or smaller, 1.02 or smaller. Such heterostructures allow for elimination or minimization of Sb, surface Sb, or excess Sb on the growth surface. Sb, surface Sb, or excess Sb on the growth surface can be susceptible to being exchanged by incoming As atoms. Exchange of Sb by As results in intermixing between subsequent layers of the heterostructure, defect creation and interface degradation during the growth or post-growth annealing. Accordingly, embodiments described herein provide a heterostructure, wherein Sb atoms are sufficiently strong bound to a surface, incorporated in the layer or are reduced or even eliminated at the surface. Thereby, exchange of Sb by other atoms, particularly by As can be reduced and the quality of the heterostructure can be improved. Also, it allows the reduction of less stable antimony oxides on the oxide-semiconductor surface, which is beneficial for improved device operation.

The above example relates to antimony being replaced by other atoms as exchange of Sb can have a stronger effect as compared to other elements. However, undesired exchange of elements in one layer during growth of another layer or from another layer, e.g. during annealing, can also be present for elements other than Sb. Accordingly, the above described intermediate layer can also be applied for boundaries between different layers of a heterostructure, where antimony is not a dominating element.

The MOSFET structure shown in FIG. 1 includes a metal layer 116 over the oxide layer 114. The metal layer 116 can serve as the gate electrode or as a contact for the gate electrode of the MOSFET. The oxide layer 114 typically serves as the dielectric layer between the channel and the gate. The insertion or intermediate layer 120 at semiconductor-oxide interface, i.e. the interface between channel 120 and the dielectric layer 114 results in formation of desired composition oxide-semiconductor bonds. Thereby, trap formation and leakage currents can be reduced, which results in boosting MOSFET performance.

Figure 2:
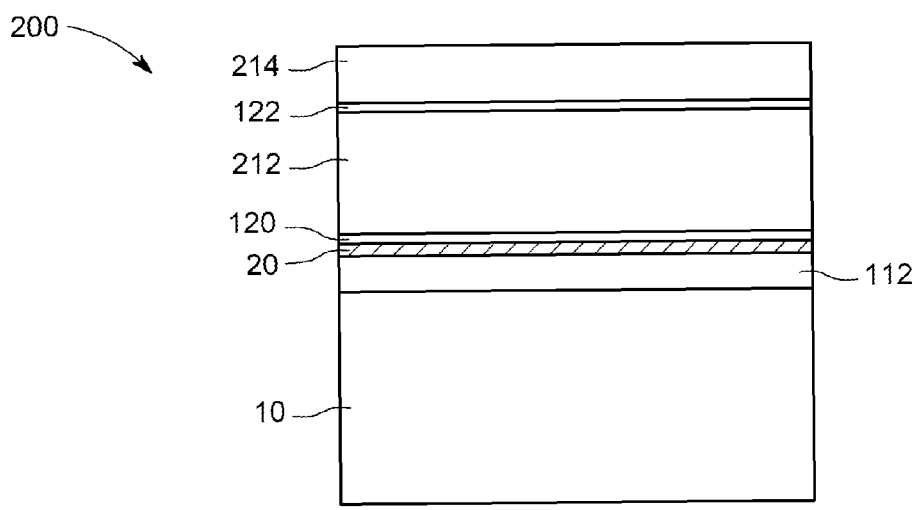
FIG. 2 shows schematically a further device with a layer stack and an intermediate layer according to embodiments described herein.

FIG. 2 shows a further heterostructure 200, which is exemplarily a structure or layer-stack for a high electron mobility transistor (HEMT). A semiconductor layer 112 is deposited or grown on the substrate 10. As described above, typically, the deposition or growing of layer is conducted with molecular beam epitaxy (MBE) or specific forms thereof. Typically, a 2D electron gas region 20 is generated at the heteriointerface due to band bending. According to some options of a specific, modified HEMT structures, above the layer 112 a further semiconductor layer 20, for the 2D electron gas can be provided. Such an additional layer can, for example, define a strict definition of an area for the 2D gas. These layers can, for example, be provided has a binary, ternary, quaternary, or quinternary semiconductor layer in the AlGaInAsSb system. A cap layer 212 is provided over the layer 112. In order to improve HEMT performance an intermediate semiconductor compound layer 120 is provided on the channel layer and below the metal layer 2141. Thereby, according to typical embodiments, which can be combined with other embodiments described herein, the insertion or intermediate layer 120 can be in direct contact with the layer 20 and the oxide layer 212. The insertion layer at heterointerface (where 2D electron gas originates) reduces interface scattering and enhances channel mobility. Further, an increased channel mobility results in increased high-speed performance (increased transit frequency, increased maximum oscillation frequency, reduced drain-source voltage)

According to embodiments described herein, the insertion or intermediate layer is deposited or grown to have an understoichiometric property $(III)_{x>1}(V)_{x<1}$, i.e. a group-V understochiometric property. Such heterostructures allow for elimination or minimization of Sb, surface Sb, or excess Sb on the growth surface. Sb, surface Sb, or excess Sb on the growth surface can be susceptible to being exchanged by incoming As atoms. Exchange of Sb by As results in intermixing between subsequent layers of the heterostructure, defect creation and interface degradation during the growth or post-growth annealing. Accordingly, embodiments described herein include a heterostructure, wherein Sb atoms are sufficiently strong bound to a surface, are incorporated in a layer to be bound therein, or are reduced or even eliminated at the surface. Thereby, exchange of Sb by other atoms, particularly by As can be reduced and the quality of the heterostructure can be improved.

The above example relates to antimony being replaced by other atoms as exchange of Sb can have a stronger effect as compared to other elements. However, undesired exchange of elements in one layer during growth of another layer or from another layer, e.g. during annealing, can also be present for elements other than Sb. Accordingly, the above described intermediate layer can also be applied for boundaries between different layers of a heterostructure, where antimony is not a dominating element.

The HEMT structure shown in FIG. 2 includes a metal layer 214 over the cap layer 212. The metal layer 214 can serve as the gate electrode or as a contact for the gate electrode of the HEMT. A further intermediate layer 122 can be provided between the cap layer 212 and the metal layer 214. Similar to the intermediate layer 120, the intermediate layer 122 is grown to have an under-stoichiometric property $(III)_{x>1}(V)_{x<1}$, i.e. a group-V under-stoichiometric property. Depending on the desired band structure of the heterostructure 200, the intermediate layers 120 and 122 can have different compositions respectively, i.e. the amount of the respective elements of Al, Ga, In, As, and Sb can vary. Yet, the amount of group-III elements and the amount of group-V elements is not stoichiometric and is given by $(III)_{x>1}(V)_{y<1}$. The intermediate or insertion layer 122 at the cap-metal interface can further induce desired (controlled composition) oxide formation, thus creating a reliable contact with reproducible characteristics.

According to embodiments described herein, intermediate or insertion layers can be utilized for the different heterostructures. These insertion layer can be provided in the quinternary compound semiconductor system of Al, Ga, In, As, and Sb such that the band gap characteristics of the desired heterostructure is not disturbed or is disturbed only to an acceptable amount. The under-stoichiometric property $(III)_{x>1}(V)_{x<1}$, i.e. a group-V under-stoichiometric property, and characteristics of the intermediate layer improves the boundary characteristics for the heterostructure layer boundaries. According to different embodiments, which can be combined with other embodiments described herein, the thickness of the intermediate layer can be 10 monolayers or below, particularly 7 monolayers or below. For example, the intermediate layers described herein can have a thickness such that the intermediate layer forms also only a part or portion of a monolayer. Thereby, the intermediate layer has a number of atoms, which do not fully cover the surface of the below deposited layer. However, the non-stoichiometric property can still be able to reduce exchange of atoms between the neighboring semiconductor layers of different composition. Yet, embodiments described herein generate a heterostructure, wherein Sb atoms are sufficiently strong bound to a surface, are incorporated in a layer to be bound therein, or are reduced or even eliminated at the surface. Thus, exchange of Sb on the growth surface by incoming As atoms can be reduced.

Figure 3:
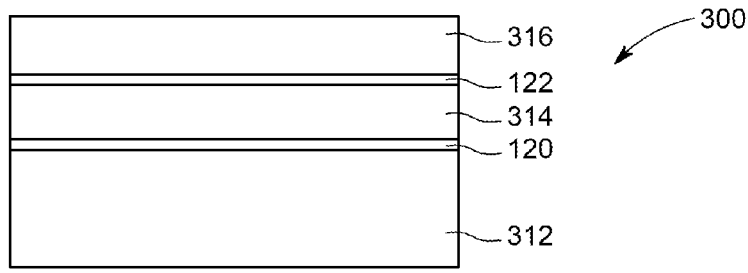
FIG. 3 shows schematically a yet further heterostructure with a layer stack and an intermediate layer according to embodiments described herein.

FIG. 3 shows a further heterostructure 300, which is exemplarily structure or layer-stack for a heterojunction bipolar transistor (HBT). Thereby a collector layer 312, a base layer 314 and an emitter layer 316 are provided. Each of the layers 312, 314 and 316 can be a binary, ternary, quaternary or quinternary layer in the system provided by Al, Ga, In, As, and Sb. For HBT structures the composition of the base layer 314 is different from the composition of the emitter layer 316. In order to improve HBT performance intermediate semiconductor compound layer 120 and 122 are provided.

According to embodiments described herein, the insertion or intermediate layers are grown to have an understoichiometric property $(III)_{x>1}(V)_{x<1}$, i.e. a group-V understoichiometric property. Such heterostructures allow for elimination or minimization of Sb, surface Sb, or excess Sb on the growth surface. Sb, surface Sb, or excess Sb on the growth surface can be susceptible to being exchanged by incoming As atoms. Depending on the desired band structure of the heterostructure 300, the intermediate layers 120 and 122 can have different compositions respectively, i.e. the amount of the respective elements of Al, Ga, In, As, and Sb can vary. Yet, the amount of group-III elements and the amount of group-V elements is not stoichiometric and is given by $(III)_{x>1}(V)_{x<1}$. The insertion or intermediate layers at the emitter-base interface and the base-collector interface improve abrupt junctions from one desired composition to another desired composition in the neighboring layer, i.e. exchange of atoms between neighboring heterostructure layers, particularly As exchanging Sb, can be reduced. This abrupt composition changes or abrupt junctions can reduce leakage currents and, thus, increased emitter efficiency.

Figure 4:
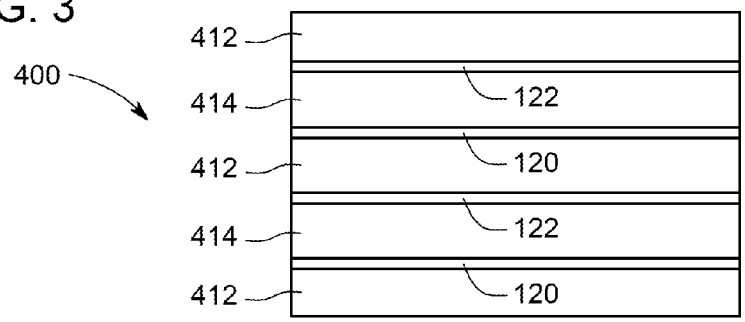
FIG. 4 shows schematically a yet further heterostructure with a layer stack and an intermediate layer according to embodiments described herein.
Figure 5:
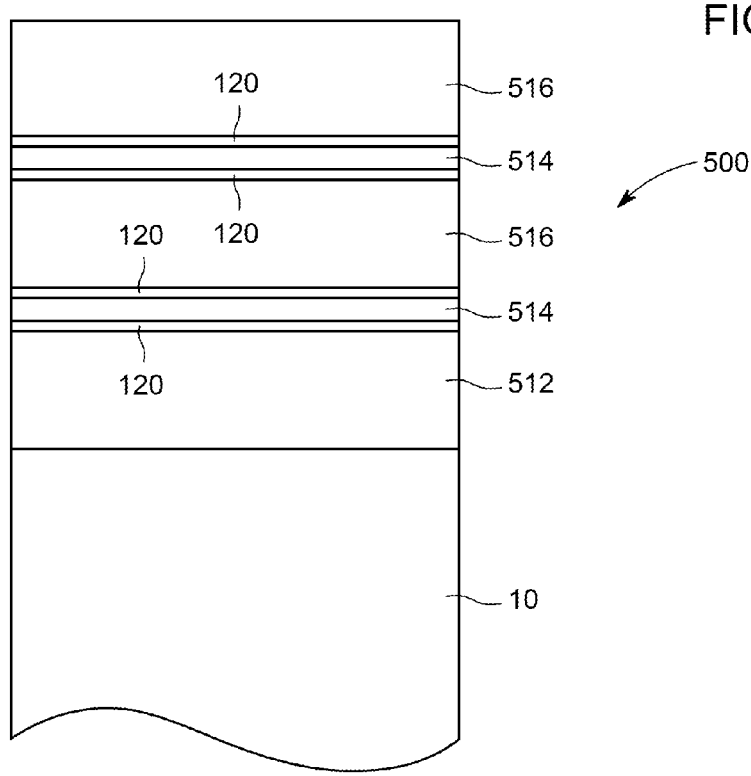
FIG. 5 shows schematically a yet further heterostructure with a layer stack and an intermediate layer according to embodiments described herein.

FIGS. 4 and 5 show heterostructures 400 and 500 for optoelectronic devices. Heterostructure 400 exemplarily shows a type II superlattice, which can be used for detectors such as IR detectors, interband cacade lasers (ICLs), or quantum cascade lasers (QCLs). Heterostructure 500 shows a structure with two quantum wells as used for lasers, light emitting diodes (LEDs) and superluminiscent light emitting diodes (SLEDs).

FIG. 4 shows a stack of first semiconductor layers 412 and second semiconductor layers 414. Thereby, typically a pair of first and second semiconductor layers is repeated at least once or at least twice, as shown in FIG. 4. For example, the pair of first and second semiconductor layers can be repeated at least 10 times and up to thousands (e.g. 2000) of times. Intermediate or insertion layers 120, 122 are provided at the heterointerfaces between the respective layers. Two different reference numerals 120 and 122 are used to indicate that the intermediate or insertion layers 120, 122 can have a different semiconductor composition depending on whether they are provided on a first semiconductor layer 412 or on a second semiconductor layer 414.

However, according to modifications of the embodiments described with respect to FIG. 4, the intermediate or insertion layers 120, 122 can also have the same composition. This can e.g. be the case if the layers 120 (122) are grown to be similar in band gap and/or other properties to either the neighboring first semiconductor layers 412 or, alternatively, to the neighboring second semiconductor layers 414. Accordingly, the intermediate or insertion layers can either be associated with the layer on which they are grown or they can be associated with a specific neighboring layer, such that the insertion layer below one of the semiconductor layers 412 or 414 and the insertion layer above the same one of the semiconductor layers 412 or 414 is associated with the same semiconductor layer 412 or 414.

According to embodiments described herein, the insertion or intermediate layers are grown to have an understoichiometric property $(III)_{x>1}(V)_{x<1}$, i.e. a group-V understoichiometric property. Such heterostructures allow for elimination or minimization of Sb, surface Sb, or excess Sb on the growth surface. Sb, surface Sb, or excess Sb on the growth surface can be susceptible to being exchanged by incoming As atoms. Insertion layers at heterointerfaces improve interface abruptness, crystalline quality, creates desired interfaces, reduces layer intermixing and enhances strain control and optical-electrical properties. These improvements are important factors for high quality type-ii superlattices and heterostructures for ICLs, and QCL as shown by heterostructure 400 of FIG. 4.

FIG. 5 shows a first barrier layer 512 grown over substrate 10. According to typical modifications thereof, also a further layer such as an absorber layer or a cladding layer can be provided between the substrate 10 and the barrier layer 512. Further, active semiconductor compound layers 514 are provided in the embodiment shown in FIG. 5. Between and above the active layers further barrier layers 516 are provided. Typically, all of these layers are provided as compound semiconductor layers. Each of the layers 512, 514 and 516 can be a binary, a ternary, quaternary or quinternary layer in the system provided by Al, Ga, In, As, and Sb. According to a particular example, the active layers or quantum wells in FIG. 5 can be provided by GaInAsSb, whereas the barrier regions are provided by GaAsSb Between these layers, intermediate or insertion layers 120 are provided. According to embodiments described herein, the insertion or intermediate layers are grown to have an understoichiometric property $(III)_{x>1}(V)_{x<1}$, i.e. a group-V understoichiometric property. Such heterostructures allow for elimination or minimization of Sb, surface Sb, or excess Sb on the growth surface. Sb, surface Sb, or excess Sb on the growth surface can be susceptible to being exchanged by incoming As atoms. Insertion layers at heterointerfaces improve interface abruptness, crystalline quality, creates desired interfaces, reduces layer intermixing and enhances strain control and optical-electrical properties.

According to a typical example, A, B, C, D, and E, each given by one of Al, Ga, In, As, and Sb can be provided as $(ABC)_1(DE)_1$ for a barrier layer 512 and/or 516. According to modifications thereof, the compound semiconductor can also be binary, ternary or quaternary such that one or more of A, B, C, D, and E is not included in the barrier layer. Typically, the thickness of the one, more, or all of the barrier layers 512, 514 can be 7 monolayers thick to 2 μm thick. In the above described abbreviation of $(ABC)_1(DE)_1$, A, B, C are group-III and D, E are group-V elements, respectively, and are grown under group-V rich conditions. Such barrier layer is followed by a thin insertion or intermediate layer 120, which can be 7 ML to parts of ML thick. The intermediate layer 120 is a compound semiconductor layer with $(ABC)_{x>1}(DE)_{x<1}$, and grown under group-III rich conditions.

The thin insertion layer 120 is followed by another compound semiconductor layer $(ABC)_1(DE)_1$, which can be an active layer 514. The active layer can be 2 μm to 7 ML thick. As shown in FIG. 5, this is then, again followed by another thin compound semiconductor insertion or intermediate layer 130 with $(ABC)_{x>1}(DE)_{x<1}$. The abovementioned structure can be repeated multiple times to create a multiple heterostructure active region, for example a multi-quantum-well active region composed of N quantum wells and N+1 barriers, where N is integer number. FIG. 5 depicts two active regions 514. However, similar structures can also have one active region or more than two active regions.

According to different embodiments, which can be combined with other embodiments described herein, the compound semiconductor layers can be grown on any desired substrate, such as GaSb, GaAs, InP, Si, InSb, InAs, GaP, and Ge.

Typically, a first semiconductor layer and/or a second semiconductor layer are grown under group-V rich conditions. This can for example, be a barrier layer, which is grown under group-V rich conditions. The first and second semiconductor layer can be grown at a temperature of 250° C. to 550° C. and up to the layer reaching a desired thickness.

Between the two semiconductor layers, an insertion or intermediate layer with under-stoichiometric properties are provided. According to yet further embodiments, e.g. a heterostructure as shown in FIG. 5, the second semiconductor layer can be the active layer, which is deposited or grown under group-V rich conditions. The active layer can be, again, followed by a second intermediate or insertion layer.

The embodiments described herein allow the elimination, minimization or reduction of Sb on the growth surface, which is very susceptible to being exchanged by incoming As atoms. Accordingly, intermixing between layers can be reduced, which, in turn reduces defect creation and interface degradation during the growth or post-growth annealing of the structures.

Particularly, in light emitting structures such above mentioned techniques allow the suppression of wavelength shift due to intermixing between active layers and barrier layers during growth and post-growth annealing. This results in improved device performance in terms of electrical, optical and temperature parameters. Moreover, such techniques allow the fabrication of devices with reproducible parameters, especially, emission wavelength and electro-optical performance from run-to-run. Thereby, it should be noted that exchange of elements, interdiffusion or the like typically results in unpredictable fluctuations in devices, which cannot be controlled. Accordingly, intermediate or insertion layers according to embodiments described herein, even though they might result in a deviation of the perfect heterostructure for a device, might still be superior as compared to common heterostructures, as the common heterostructures show unpredictable fluctuations due to lack of control of exchange of elements.

In general, such abovementioned heterostructure can be applied to a variety of semiconductor devices as described herein. Thereby, light emitting devices or light absorbing structures can be selected from the group consisting of: a laser, an LED, an SLED, an ICL, a QCL, a photo detector, and a type-II superlattice detector. Transistors can be selected from the group consisting of: a HBT, a MOSFET, a FET, and a HEMT. The improved properties of such heterostructures can be particularly useful for optoelectronic device, because the improvement might be especially useful for structures where electrical and optical properties are to be improved at the same time.

According to embodiments described herein, intermediate or insertion layers can be utilized for the different heterostructures. These insertion layer can be provided in the quinternary compound semiconductor system of Al, Ga, In, As, and Sb such that the band gap characteristics of the desired heterostructure is not disturbed or is disturbed only to an acceptable amount. The non-stoichiometric characteristics of the intermediate layer improves the boundary characteristics for the heterostructure layer boundaries. According to different embodiments, which can be combined with other embodiments described herein, the thickness of the intermediate layer can be 10 monolayers or below, particularly 7 monolayers or below. For example, the intermediate layers described herein can have a thickness such that the intermediate layer forms also only a part or portion of a monolayer. Thereby, the intermediate layer has a number of atoms, which do not fully cover the surface of the below deposited layer. However, the non-stoichiometric property can still be able to reduce exchange of atoms between the neighboring semiconductor layers of different composition. Further, utilizing the insertion or intermediate layers allows for higher concentration gradients as the exchange of atoms or intermixing of elements is reduced.

While the foregoing is directed to embodiments of the invention, other and further embodiments of the invention may be devised without departing from the basic scope thereof, and the scope thereof is determined by the claims that follow.

The invention claimed is:

1. III-V compound semiconductor heterostructure grown on a substrate, comprising:
 a first semiconductor layer, wherein the first semiconductor layer is a compound semiconductor layer with $(III)_1(V)_1$, wherein (III) represents one or more group-III elements and (V) represents one or more group-V elements;
 an intermediate layer on the first semiconductor layer, wherein the intermediate layer is a group-V understoichiometric compound semiconductor layer with $(III)_{x>1}(V)_{2-x}$, wherein x is smaller than 2, and wherein the intermediate layer has a thickness of 10 monolayers or below; and
 a second semiconductor layer, wherein the first semiconductor layer and the second semiconductor layer are essentially stoichiometric semiconductor layers, and wherein the intermediate layer comprises at least one of a group-V element that is different from the one or more group-V elements of the first semiconductor layer, or a group-V element that is same as the one or more group-V elements of the first semiconductor layer, in a different concentration from the concentration of the group-(V) element in the first semiconductor layer.

2. The heterostructure according claim 1, wherein the first semiconductor layer is a molecular beam epitaxy grown layer and wherein the second semiconductor layer is a molecular beam epitaxy grown layer.

3. The heterostructure according to claim 1, wherein the substrate is selected from the group consisting of: GaSb, GaAs, InP, Si, InSb, InAs, GaP, and Ge.

4. The heterostructure according claim 1, further comprising:
 one or more further molecular beam epitaxy grown semiconductor layers, wherein the one or more further semiconductor layers are a compound semiconductor layer with $(III)_1(V)_1$; and
 one or more further intermediate layers, wherein the one or more intermediate layers are a compound semiconductor layer with $(III)_{x>1}(V)_{2-x}$, wherein the one or more further intermediate layer have a respective thickness of 10 monolayers or below, and wherein the one or more further semiconductor layers are separated by the one or more further intermediate layers.

5. The heterostructure according to claim 1, wherein the heterostructure provides a device selected from the group consisting of: a light emitting device, a laser, an LED, an SLED, a transistor, an HBT, a MOSFET, a FET, a photodetector, a type-II superlattice detector structure, an interband cascade laser (ICL), and a quantum cascade laser (QCL).

6. The heterostructure according to claim 1, wherein the first semiconductor layer forms a barrier layer and the second semiconductor layer forms an active layer or vice versa, or wherein the first semiconductor layer forms a waveguiding barrier layer and the second semiconductor layer forms an active layer for a quantum well region or vice versa.

7. The heterostructure according to claim 1, wherein the first semiconductor layer and the second semiconductor layer are grown under group-V rich conditions.

8. The heterostructure according to claim 1, wherein x is 1.1 or smaller.

9. III-V compound semiconductor heterostructure grown on a substrate, comprising:
 a first semiconductor layer, wherein the first semiconductor layer is a compound semiconductor layer with $(III)_1(V)_1$, wherein (III) represents one or more group-III elements and (V) represents one or more group-V elements;
 an intermediate layer on the first semiconductor layer, wherein the intermediate layer is a group-V understoichiometric compound semiconductor layer with $(III)_{x>1}(V)_{2-x}$, wherein x is smaller than 2, and wherein the intermediate layer has a thickness of 10 monolayers or below;
 a second semiconductor layer, wherein the first semiconductor layer and the second semiconductor layer are essentially stoichiometric semiconductor layers;
 one or more further molecular beam epitaxy grown semiconductor layers, wherein the one or more further semiconductor layers are a compound semiconductor layer with $(III)_1(V)_1$; and
 one or more further intermediate layers, wherein the one or more intermediate layers are a compound semiconductor layer with $(III)_{x>1}(V)_{2-x}$, wherein the one or more further intermediate layer have a respective thickness of 10 monolayers or below, and wherein the one or more further semiconductor layers are separated by the one or more further intermediate layers.

10. III-V compound semiconductor heterostructure grown on a substrate, comprising:
- a first semiconductor layer, wherein the first semiconductor layer is a compound semiconductor layer with $(III)_1(V)_1$, wherein (III) represents one or more group-III elements and (V) represents one or more group-V elements;
- an intermediate layer on the first semiconductor layer, wherein the intermediate layer is a group-V under-stoichiometric compound semiconductor layer with $(III)_{x>1}(V)_{2-x}$, wherein x is smaller than 2, and wherein the intermediate layer has a thickness of 10 monolayers or below; and
- a second semiconductor layer, wherein the first semiconductor layer and the second semiconductor layer are essentially stoichiometric semiconductor layers,
- wherein the first semiconductor layer and the second semiconductor layer are grown under group-V rich conditions.

\* \* \* \* \*